(12) United States Patent
Jung

(10) Patent No.: US 7,754,575 B2
(45) Date of Patent: Jul. 13, 2010

(54) INDUCTOR AND METHOD FOR MANUFACTURING THE SAME

(75) Inventor: Ji Houn Jung, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 293 days.

(21) Appl. No.: 11/893,912

(22) Filed: Aug. 17, 2007

(65) Prior Publication Data

US 2008/0054397 A1 Mar. 6, 2008

(30) Foreign Application Priority Data

Aug. 29, 2006 (KR) .................. 10-2006-0082425

(51) Int. Cl.
*H01L 21/20* (2006.01)

(52) U.S. Cl. .............................. 438/381; 257/E21.022; 257/531

(58) Field of Classification Search ................. 257/531, 257/536, E21.022; 438/381, 382, 383
See application file for complete search history.

(56) References Cited

U.S. PATENT DOCUMENTS

| 5,266,819 | A | * | 11/1993 | Chang et al. ............... 257/198 |
| 6,478,975 | B1 | * | 11/2002 | Ju .............................. 216/6 |
| 2002/0145175 | A1 | | 10/2002 | Shitara |
| 2005/0181570 | A1 | | 8/2005 | Huang |

\* cited by examiner

*Primary Examiner*—Lex Malsawma
*Assistant Examiner*—Robert Huber
(74) *Attorney, Agent, or Firm*—The Law Offices of Andrew D. Fortney; Andrew D. Fortney

(57) ABSTRACT

A method for manufacturing an inductor according to the embodiment comprises the steps of: forming a first photoresist pattern; forming an impurity region forming the inductor by implanting an impurity ion to the substrate by means of the first photoresist pattern and a pad region applying current across the impurity region; forming a second photoresist pattern so that a position spaced by a predetermined interval from the impurity region is opened; and forming a guard impurity region in the position spaced from the impurity region by implanting the same impurity ion as the impurity ion by means of the second photoresist pattern.

20 Claims, 3 Drawing Sheets

INDUCTOR AND METHOD FOR MANUFACTURING THE SAME

The present application claims priority under 35 U.S.C. 119 and 35 U.S.C. 365 to Korean Patent Application No. 10-2006-0082425 (filed on Aug. 29, 2006), which is hereby incorporated by reference in its entirety.

BACKGROUND

Embodiments of the invention relate to an inductor and a method for manufacturing the same.

As the wireless mobile communication field has rapidly been developed, high frequency resources have been in demand, and the request for a device and a circuit operating in the high frequency has been increased. The devices that are used in a high frequency region may be classified as radio frequency (RF) components and/or integrated circuits (IC's).

Also, as advanced processing techniques have been developed, complementary metal-oxide semiconductor (CMOS) circuitry has good high frequency characteristics. Since the CMOS manufacturing technology is based on silicon, it can manufacture a low-cost chip using well-developed processing techniques, and can integrate circuitry operating in an intermediate frequency band and digital circuitry and/or logic as part of a system such as a system on chip (SOC). Therefore, CMOS technology has been considered to be suitable process technology for manufacturing a single RF chip.

Meanwhile, the RF IC technique combines device manufacturing techniques, circuit design techniques, and high frequency packaging techniques. Only when the respective techniques are developed in balance, a competitive RF-CMOS device can be developed. To remain competitive, one important thing is to reduce the manufacturing costs. To this end, the process may be simplified and stabilized. The main constituents of RF-CMOS or bipolar/BiCMOS devices are a RF MOSFET, an inductor, a varactor, a metal-insulator-metal (MIM) capacitor, and a resistor.

In particular, although the inductor is indispensably used in a radio frequency chip, it occupies the largest area of the chip of any single device. Inductors also have many restrictions on the high frequency characteristics thereof, due to parasitic capacitance and resistance components that may depend on peripheral materials, structures, and internal materials.

The related art has generally applied planar spiral geometries for manufacturing an inductor. In other words, the top metal layer of a device or IC is implemented on a two-dimensional plane using certain geometric structures, represented by a rectangular type, an octagonal type, and a circular type, etc. Although the inductors in such various types can somewhat improve an inductance depending on the type, every type of inductor occupies a relatively large area in the high frequency chip.

SUMMARY

Embodiments of the invention provide an inductor having a simple manufacturing method.

One embodiment provides an inductor having a small area within a chip. Various other embodiments provide an inductor having excellent electrical characteristics due to a reduction of parasitic capacitance.

A method for manufacturing an inductor according to one embodiment comprises the steps of: forming a first photoresist pattern; implanting an impurity ion into the substrate using the first photoresist pattern as a mask to form an inductor region and a pad region, the pad region configured to apply current across the inductor region; forming a second photoresist pattern to expose a position a predetermined interval from the inductor region; and forming a guard region in the exposed position by implanting the same type of impurity ion as in the inductor region using the second photoresist pattern as a mask.

An inductor according to embodiments of the invention comprises: a first impurity implant region comprising a plurality of serpentine patterns in which at least a portion of each serpentine pattern overlap a portion of another serpentine section in a specific direction; and a pad region comprising a second impurity implant region having an identical impurity ion (and, in one embodiment, in an identical dose) as the first impurity implant region, configured to apply current across the first impurity implant region.

DETAILED DESCRIPTION OF THE EMBODIMENTS

Hereinafter, an inductor and a method for manufacturing the same according to embodiments of the invention will be described in detail with reference to the accompanying drawings.

In one embodiment, an inductor is formed by implanting an impurity ion into a wafer in a predetermined pattern. The inductor is a core component used in RF IC's for various electronic equipment such as cellular phones, electronic note books and personal digital assistants (PDA's), camcorders, and digital cameras. The inductor is generally implemented on the surface of the wafer according to the trends of miniaturization, reduced weight, and reduced thickness.

Since the inductor may be formed by means of ion implantation, the inductor can be miniaturized and the manufacturing process thereof can be simple. Also, as the inductor is formed on the wafer, existing passive devices can be made on a single chip.

Figure 3:
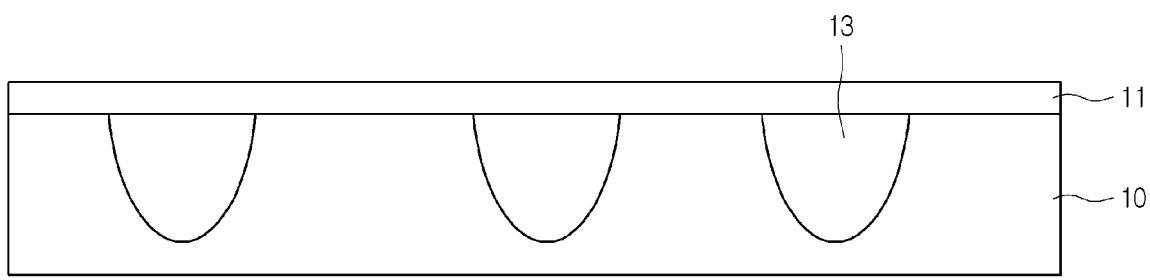
Figure 4:
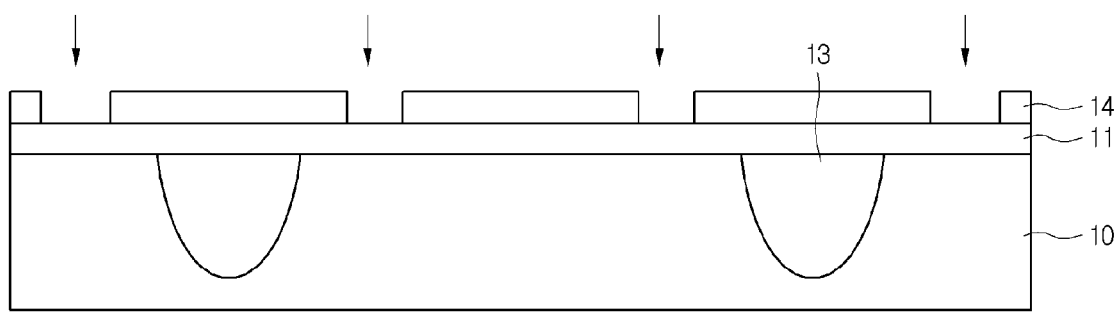
Figure 5:
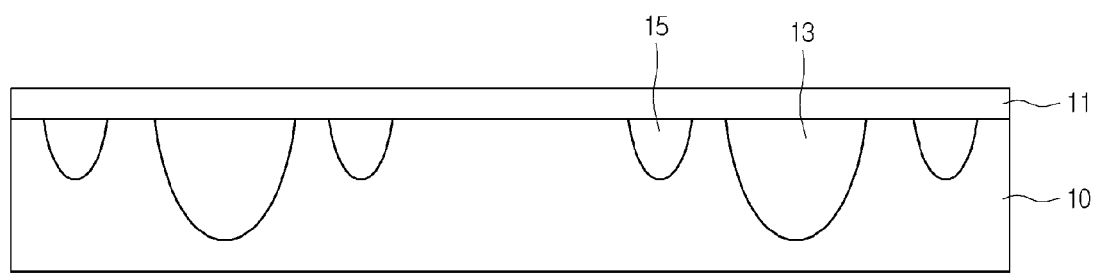
Figure 6:
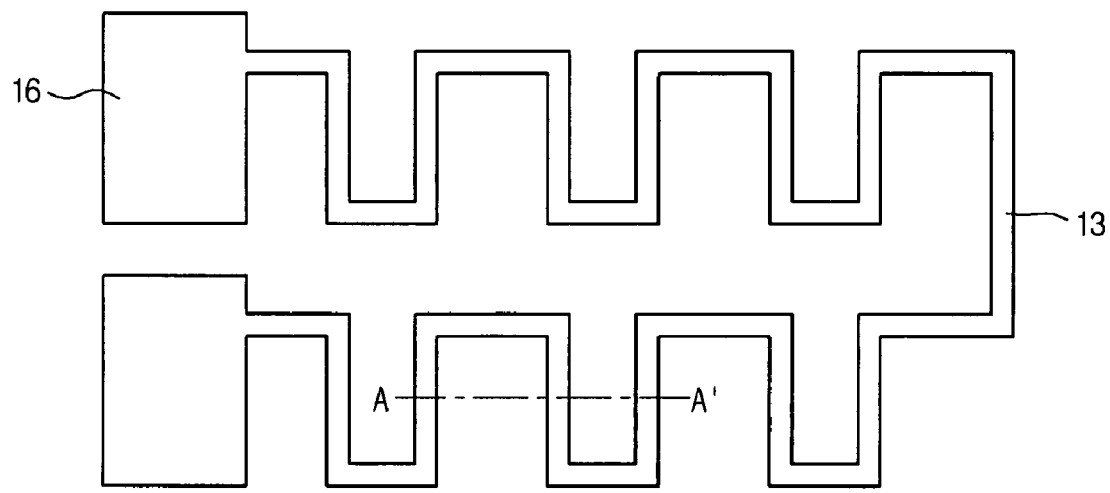
FIGS. 6 and 7 are views seen from the upper side of an inductor.

FIGS. 1 to 4 are views explaining a method for manufacturing an inductor according to one embodiment of the invention; and FIGS. 5 and 6 are views seen from the upper side of the inductor.

Figure 1:
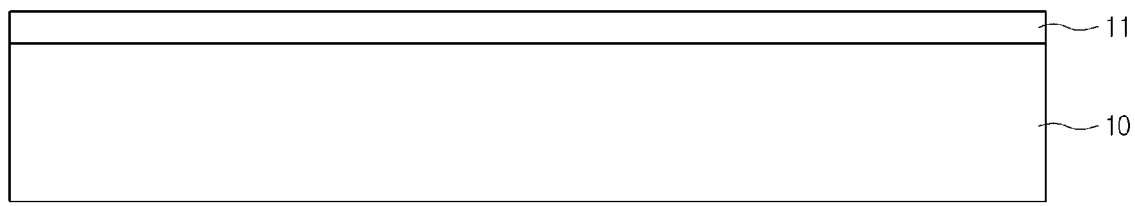
FIGS. 1 to 5 are views explaining a method for manufacturing an inductor according to the embodiment.

As shown in FIG. 1, an oxide film 11 for protecting the surface of the substrate 10 (e.g., a silicon wafer) is first formed on the substrate 10. The oxide film 11 can be formed at a thickness of about 100 Å by means of a thermal oxidation process, chemical vapor deposition (CVD) process, plasma assisted CVD process, etc. Meanwhile, various devices such as a transistor, a capacitor, a resistor, etc. can be formed on the substrate 10.

Figure 2:
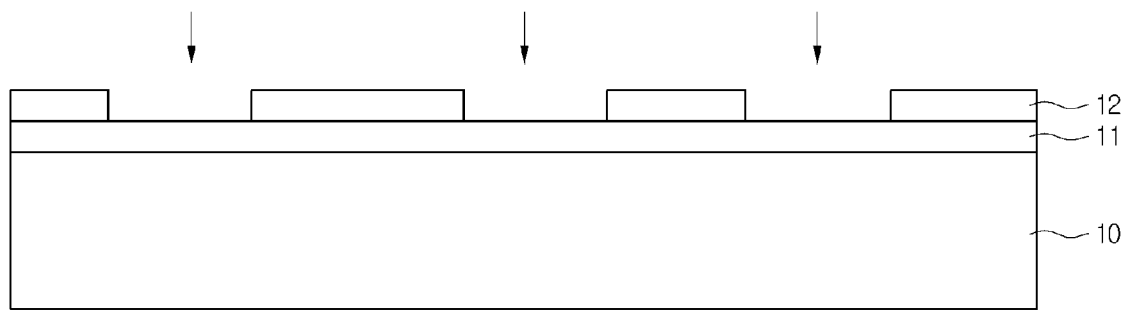

And, as shown in FIG. 2, a photoresist pattern 12 for forming the inductor region can be formed in a predetermined shape. Then, the photoresist pattern 12 is removed after the impurity ion is implanted into the inductor region. The impurity ion performs the same function as a metal inductor pattern of the related art, and the inductor is formed by implantation of the impurity ion into the region exposed by photoresist pattern 12.

The inductor can have a planar spiral geometry where a plurality of bending parts (e.g., serpentine patterns) are formed, wherein it can have various shapes such as a rectangular shape, an octagonal shape, and a circular shape, etc. As the impurity ion, boron (B), which is a P type impurity, may be used, or phosphorus (P) and/or arsenic (As), which are N type impurities, may also be used. Preferably, the impurity ion for the inductor region is implanted in a high dose or high concentration, such as from $1\times10^{16}$ to $1\times10^{21}/cm^2$, from $1\times10^{18}$ to $1\times10^{21}/cm^2$, or from $1\times10^{19}$ to $1\times10^{21}/cm^2$, etc.

The serpentine shape of the inductor impurity ion region, provided by the photoresist pattern 12, is shown in FIG. 6. As shown in FIG. 6, implantation of the impurity ions forms an inductor impurity region 13 and an electrically connected pad 16 for a wiring connection.

FIG. 3 shows the cross-section of the inductor taken along lines A-A' of FIG. 6. Axis A-A' of FIG. 6 also defines a long axis (or predetermined direction) of a serpentine pattern of inductor impurity region 13 (e.g., the lower half of inductor impurity region 13). As can be seen in FIG. 6, when looking along the plane of the page, the serpentine pattern in the lower half of inductor impurity region 13 overlaps the serpentine pattern in the upper half of inductor impurity region 13.

As described above, a method for manufacturing an inductor according to one embodiment implants an impurity ion in a predetermined pattern into a substrate 10 to form an inductor impurity region 13 and a pad 16 configured to apply current across the impurity region 13, making it possible to form the inductor.

Thereafter, a metal wiring can be connected to the pad 16, and a well-known technique can selectively be used for the method for forming the metal wiring and the detailed description thereof will thus be omitted.

Meanwhile, owing to the increase of the parasitic capacity between the impurity regions 13 forming the inductor, the Q-factor of the inductor is lower and the self resonant frequency characteristics may deteriorate so that the inductor may have a difficulty in satisfying certain predetermined characteristics for the RF device. In other words, another embodiment of the invention forms a guard region for minimizing the interference between different portions of the impurity regions 13.

As shown in FIG. 4, a photoresist pattern 14 in a predetermined shape for forming the guard region is formed and then, the photoresist pattern 14 is removed after the impurity ion is implanted. At this time, the region of the substrate 10 into which the impurity ion is implanted is a region spaced apart by a predetermined interval from the impurity region 13 forming the inductor. Typically, this predetermined interval is at least one critical dimension (CD), or minimum width of a photoresist pattern that can be formed by the photolithography equipment used for the manufacturing process.

Also, as the impurity ion for forming the guard impurity region, boron (B), phosphorus (P), and arsenic (As) may be used, as described above. The impurity, a conductive impurity, is generally the same (or the same type) as the impurity implanted into the impurity region 13 forming the inductor.

Figure 7:
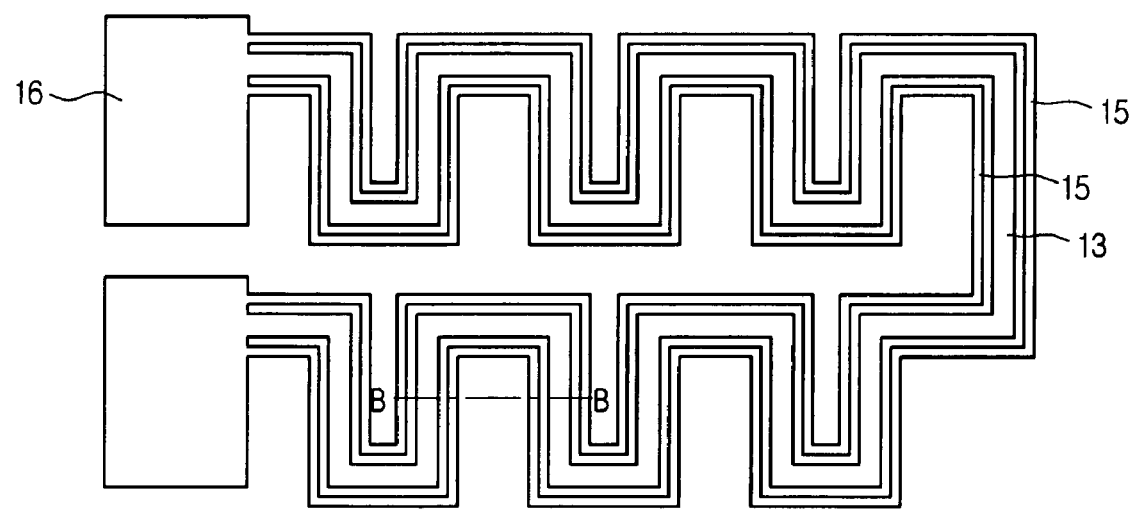

FIG. 5 shows that the guard region 15 is formed by implantation of the impurity ion. The diffusion depth of the impurity ion in the guard region 15 is preferably from 40 to 60% of the depth of the impurity region 13. The shape of the guard region 15 (defined by the photoresist pattern 14) is shown in FIG. 7. As shown in FIG. 7, the guard region 15 is formed by ion implantation.

FIG. 5 shows the cross-section of the inductor taken along lines B-B' of FIG. 7.

The guard region 15 can reduce mutual interference between the impurity regions 13, wherein it suppresses the electric field and the magnetic field between the impurity regions 13. In other words, in the impurity region 13 and the guard region 15, the same electric field occurs, reducing or preventing the loss of the electric field in the impurity region 13.

As described above, embodiments of the invention form an inductor region 13 in a predetermined pattern, having a plurality of serpentine parts or curvatures on the substrate 10 to form the inductor.

Also, with some embodiments, the guard region 15 having the same impurity ion is formed to reduce or prevent the loss of the electric field in the inductor region 13, improving the characteristics of the inductor.

In particular, the diffusion depth of the guard impurity region 15 may be in the range of 40 to 60% of the depth of the impurity region 13, minimizing the loss of the electric field in the impurity region 13.

With the method for manufacturing the inductor according to embodiments of the invention, the inductor is formed by implanting impurity ions in the substrate, having an advantage that the manufacturing method is simple. Also, the invention can provide an inductor having a minimum area within a chip and can provide the inductor with excellent electrical characteristics due to the reduction or minimization of the parasitic capacitance.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an inductor, comprising:
    forming a first photoresist pattern on a substrate;
    implanting a first impurity ion into the substrate using the first photoresist pattern as a mask to form an inductor region and a pad region, the pad region configured to apply current across the inductor region;
    forming a second photoresist pattern to expose a position of the substrate a predetermined interval from the impurity region; and
    forming a guard region in the exposed position by implanting a second impurity ion having an identical type as the first impurity ion using the second photoresist pattern as a mask, wherein a diffusion depth of the guard region is less than a diffusion depth of the inductor region.

2. The method according to claim 1, further comprising forming an oxide film on the substrate.

3. The method according to claim 1, wherein the inductor region comprises a plurality of serpentine sections.

4. The method according to claim 3, wherein at least a portion of each serpentine section overlaps a portion of another serpentine section in a specific direction.

5. The method according to claim 1, wherein the first and second impurity ions comprise boron (B) or phosphorus (P).

6. The method according to claim 1, wherein the inductor region comprises a planar spiral geometry.

7. The method according to claim 1, wherein the diffusion depth of the guard region is from 40 to 60% of the diffusion depth of the inductor region.

8. The method according to claim 2, wherein the oxide film has a thickness of about 100 Å.

9. The method according to claim 2, wherein forming the oxide film comprises a thermal oxidation process.

10. The method according to claim 2, wherein forming the oxide film comprises a plasma assisted CVD process.

11. The method according to claim 1, further comprising removing the first photoresist pattern after the first impurity ion is implanted into the substrate.

12. The method according to claim 1, further comprising removing the second photoresist pattern after the second impurity ion is implanted into the substrate.

13. The method according to claim 1, wherein the predetermined interval is at least one critical dimension (CD).

14. The method according to claim 13, wherein the critical dimension (CD) is a minimum width of the second photoresist pattern that can be formed by the photolithography equipment used to form the second photoresist pattern.

15. The method according to claim 1, wherein the impurity ion for the inductor region is implanted at a concentration of from $1 \times 10^{16}$ to $1 \times 10^{21}/cm^2$.

16. The method according to claim 14, wherein the concentration is from $1 \times 10^{18}$ to $1 \times 10^{21}/cm^2$.

17. The method according to claim 14, wherein the concentration is from $1 \times 10^{19}$ to $1 \times 10^{21}/cm^2$.

18. The method according to claim 1, wherein the first and second impurity ions comprise arsenic (As).

19. The method according to claim 1, wherein the guard region is parallel to the inductor region.

20. The method according to claim 13, wherein the guard region has a width less than that of the inductor region.

* * * * *